(12) United States Patent
Akimoto (10) Patent No.: US 6,567,154 B2
(45) Date of Patent: May 20, 2003

(54) STEP AND SCAN PROJECTION EXPOSURE APPARATUS, MAINTENANCE METHOD THEREFOR, AND SEMICONDUCTOR DEVICE MANUFACTURING METHOD AND SEMICONDUCTOR MANUFACTURING FACTORY USING THE APPARATUS

(75) Inventor: Satoshi Akimoto, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/893,671

(22) Filed: Jun. 29, 2001

(65) Prior Publication Data

US 2002/0001915 A1 Jan. 3, 2002

(30) Foreign Application Priority Data

Jul. 3, 2000 (JP) .................................. 2000-200498

(51) Int. Cl.[7] .............................................. G03B 27/42
(52) U.S. Cl. ............................................................ 355/53
(58) Field of Search ................... 385/53, 55; 430/30, 430/311; 318/649

(56) References Cited

U.S. PATENT DOCUMENTS 6,331,885 B1 * 12/2001 Nishi ........................... 355/53

* cited by examiner

Primary Examiner—John F. Niebling
Assistant Examiner—Andre' C Stevenson
(74) Attorney, Agent, or Firm—Fitzpatrick, Cella, Harper & Scinto

(57) ABSTRACT

In a step & scan projection exposure apparatus having a controller for setting for each step driving a step driving profile on the basis of a scan synchronization error, the step driving profile can be set by the exposure region layout, step direction, scan driving profile, and the like. Also, the step driving profile is determined by parameters such as the accelerations and speeds of reticle and wafer stages, the time taken until synchronous scan driving starts after step driving, and the time taken until exposure starts after the start of synchronous scan driving. A method of maintaining the apparatus by using a network, a semiconductor device manufacturing method, and a semiconductor manufacturing factory are also provided.

11 Claims, 13 Drawing Sheets

URL | http://www.maintain.co.jp/db/input.html

TROUBLE DB INPUT WINDOW

OCCURRENCE DATA | 2000/3/15 | —404
TYPE OF APPARATUS | ********** | —401
OBJECT | OPERATION ERROR (START-UP ERROR) | —403
APPARATUS S/N | 465NS4580001 | —402
DEGREE OF URGENCY | D | —405
SYMPTOM | LED KEEPS FLICKERING AFTER POWER-ON | —406
REMEDY | POWER ON AGAIN (PRESS RED BUTTON IN ACTIVATION) | —407
PROGRESS | INTERIM HAS BEEN DONE | —408

[SEND] [RESET]    410             411            412
LINK TO RESULT LIST DATABASE   SOFTWARE LIBRARY   OPERATION GUIDE

FIG. 12

SEMICONDUCTOR DEVICE MANUFACTURING FLOW

FIG. 13

STEP AND SCAN PROJECTION EXPOSURE APPARATUS, MAINTENANCE METHOD THEREFOR, AND SEMICONDUCTOR DEVICE MANUFACTURING METHOD AND SEMICONDUCTOR MANUFACTURING FACTORY USING THE APPARATUS

FIELD OF THE INVENTION

The present invention relates to a scan projection exposure apparatus and, more particularly, to a step & scan projection exposure apparatus for synchronously driving a mask for forming a semiconductor element and a substrate such as a semiconductor wafer, and sequentially exposing a plurality of exposure regions on the semiconductor wafer to a circuit pattern on the mask.

The present invention further relates to a method of maintaining the exposure apparatus by using a network, and a semiconductor device manufacturing method and semiconductor manufacturing factory using the network and exposure apparatus.

BACKGROUND OF THE INVENTION

A step & scan projection exposure apparatus synchronously drives a reticle stage which supports a mask (to be referred to as a "reticle" hereinafter) and a wafer stage which supports a semiconductor wafer, and projects a circuit pattern on a reticle to each exposure region (shot region) on a semiconductor wafer. After one shot region is exposed, the wafer and reticle stages must move (to be referred to as "step driving" hereinafter) to the next shot region to be exposed.

In exposure by scan driving, the synchronization error between the reticle and wafer stages must fall within a predetermined allowable range. Step driving increases a synchronization error, which must fall within the allowable range by the start of exposure after the start of scan driving. To meet this condition, the parameters of a step driving profile, such as the accelerations and speeds of the two stages in step driving and a time (to be referred to as a "settling time" hereinafter) taken from the end of step driving to the start of scan driving must be set in a controller for controlling the step & scan projection exposure apparatus. Conventionally in an apparatus of this type, parameters which make the scan synchronization error at a shot exhibiting the largest scan synchronization error be equal to or smaller than an allowance a are determined, and the determined parameters are set to the same values in all step driving operations.

In the prior art, as described above, the parameters of the step driving profile are set to the same values in all step driving operations.

In practice, however, the convergence of the synchronization error after step driving changes depending on conditions such as the shot region layout, shot (position on the wafer stage), step direction, step driving acceleration, speed, and settling time. If the parameters of the step driving profile are set to the same values, like the prior art, they must be set based on an estimated worst case value. In general, the synchronization error is reduced by setting a low acceleration, low speed, and long settling time in step driving, which results in a long step driving time and low throughput (productivity) of the exposure apparatus. Conventional setting of the step driving profile based on the worst case value excessively decreases the throughput.

SUMMARY OF THE INVENTION

The present invention has been made to overcome the conventional drawbacks, and has as its object to increase the throughput of a step and scan exposure apparatus by optimizing the parameters of a step driving profile for every step driving without increasing the scan synchronization error between reticle and wafer stages during exposure.

According to the present invention, the foregoing object is attained by providing a step & scan projection exposure apparatus comprising: a master stage which can move while supporting a master; a substrate stage which can move in synchronism with the master stage while supporting a substrate; and a controller for controlling synchronous scan driving of the master stage and substrate stage, and setting for each step driving a step driving profile used to perform step driving on the basis of a synchronization error between the master stage and the substrate stage.

According to another aspect of the present invention, the foregoing object is attained by providing a semiconductor device manufacturing method comprising the steps of: installing, in a semiconductor manufacturing factory, manufacturing apparatuses for performing various processes including an exposure apparatus for exposing a substrate to a pattern; and manufacturing a semiconductor device by using the manufacturing apparatuses in a plurality of processes, the exposure apparatus having a master stage which can move while supporting a master, a substrate stage which can move in synchronism with the master stage while supporting a substrate, and a controller for controlling synchronous scan driving of the master stage and substrate stage, and setting for each step driving a step driving profile used to perform step driving on the basis of a synchronization error between the master stage and the substrate stage.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

<Embodiments of Exposure Apparatus>

The basic arrangement and operation of a step & scan projection exposure apparatus will be described with reference to FIGS. 1 to 3.

Figure 1:
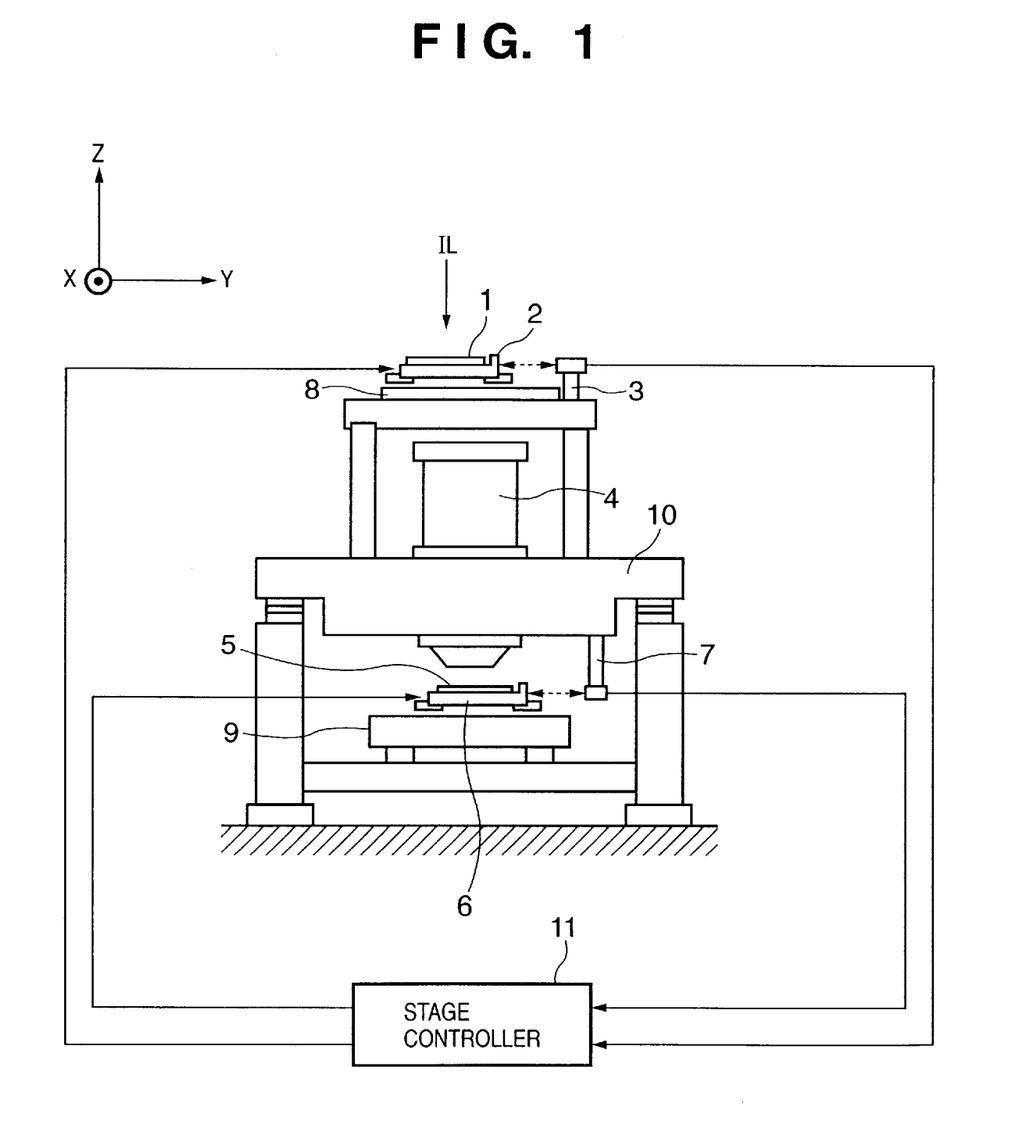
FIG. 1 is a view showing the schematic arrangement of a step & scan projection exposure apparatus according to an embodiment of the present invention.

FIG. 1 is a view showing the schematic arrangement of a step & scan projection exposure apparatus according to an embodiment of the present invention.

A reticle 1 having a circuit pattern is illuminated with slit illumination light IL uniform in illuminance. The pattern of the reticle 1 is projected onto a wafer 5 for forming a semiconductor device by synchronizing a reticle stage 2 and wafer stage 6 at the reduction magnification of a projection lens 4 in the X direction of the slit (longitudinal direction) and at a speed corresponding to the reduction magnification ratio of the projection lens 4 in the Y direction (widthwise direction).

A laser interferometer 3 for the reticle stage measures a displacement in the Y direction of the reticle stage 2, and transmits the measurement result to a stage controller 11. Similarly, a laser interferometer 7 for the wafer stage measures a displacement in the Y direction of the wafer stage 6, and transmits the measurement result to the stage controller 11.

The stage controller 11 controls the reticle stage 2 and wafer stage 6 independently or synchronously on the basis of the measurement values of the two interferometers. The laser interferometers 3 and 7, the projection lens 4, a reticle stage surface plate 8, and a wafer stage surface plate 9 constitute a main body structure 10, and the reticle stage 2 and wafer stage 6 can be synchronously controlled by using the main body structure 10 as a reference. In the step & scan projection exposure apparatus, an error in synchronous control (synchronization error) is an important factor which influences the exposure performance. In the present invention, the stage controller 11 comprises a control function of setting the step driving profile of step driving for each step driving.

Figure 2:
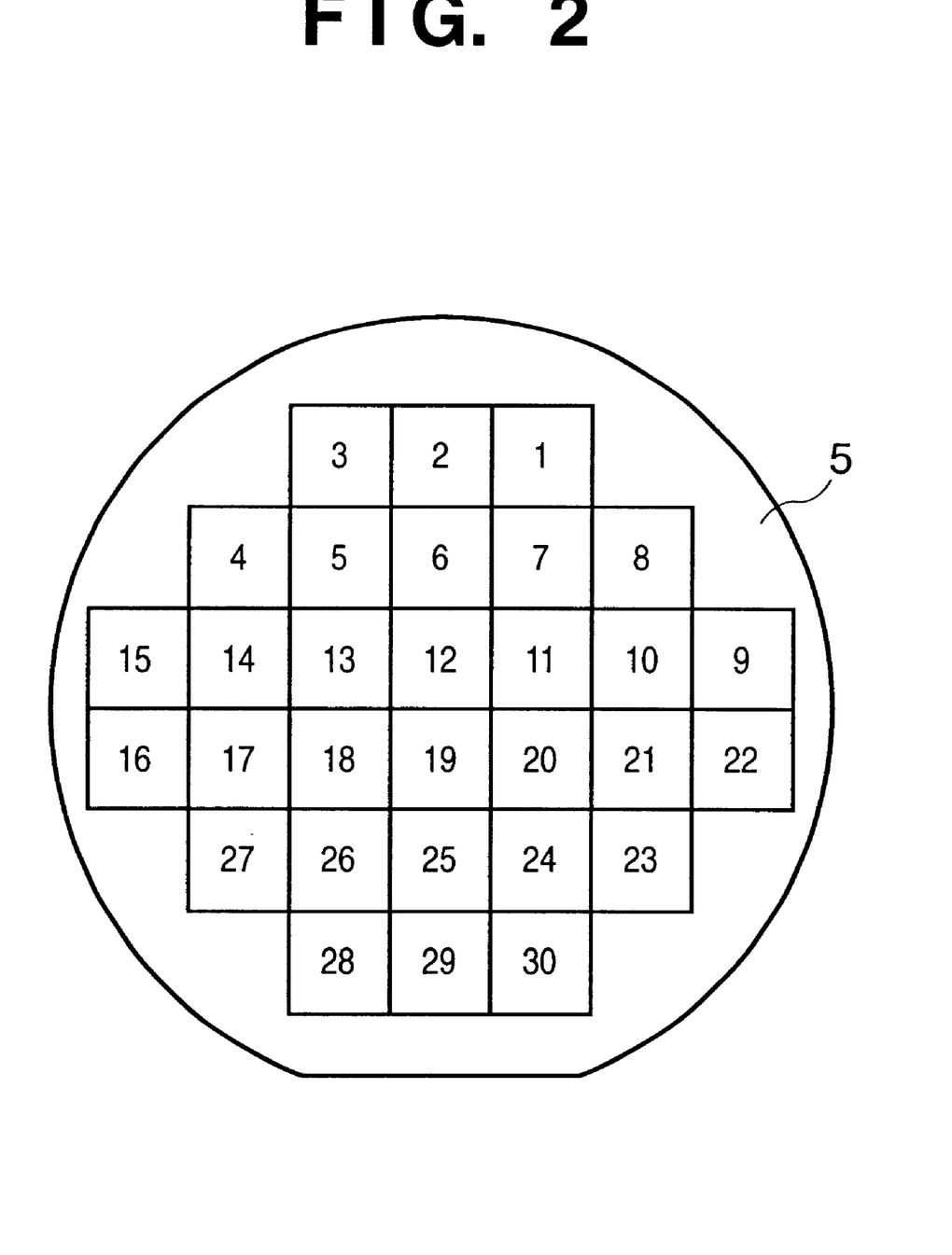
FIG. 2 is a schematic view showing a shot layout example of a wafer.

FIG. 2 shows a shot layout example when the exposure region on the wafer 5 is divided into 30 shots. Numbers in the shots represent a step operation order (exposure order).

Figure 3:
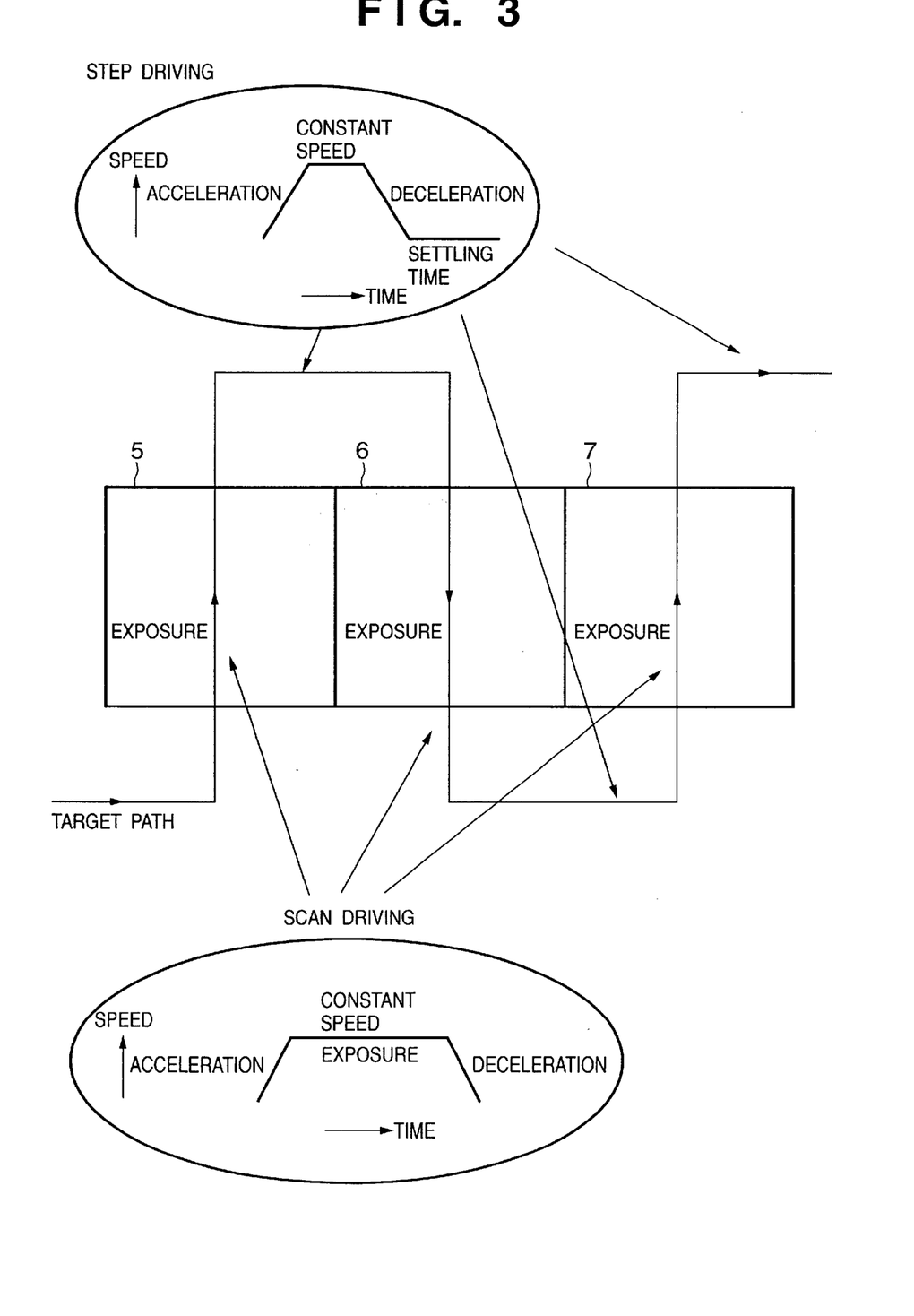
FIG. 3 is a schematic view showing step & scan operation in a step & scan projection exposure apparatus.

FIG. 3 is a view showing examples of the target paths of scan driving and step driving of the wafer stage 6 (i.e., the target path of projection light) at the fifth to seventh shots in FIG. 2, and the speed waveforms (driving profiles) of scan driving and step driving.

After the fifth shot is exposed by scan driving, the wafer stage 6 is moved by step driving so as to move the sixth shot close to the optical axis. At this time, the operation: acceleration→constant speed→deceleration is performed. Upon a given settling time (standby time), scan driving at the sixth shot starts. A desired exposure result cannot be obtained unless the driving synchronization error between the wafer stage 6 and the reticle stage 2 is equal to or smaller than a certain allowance by the start of exposure after the start of scan driving. The allowance, which is represented by α in this case, changes depending on the process.

Setting of the driving profile for each step driving as the feature of the present invention will be described.

First Embodiment

Figure 4:
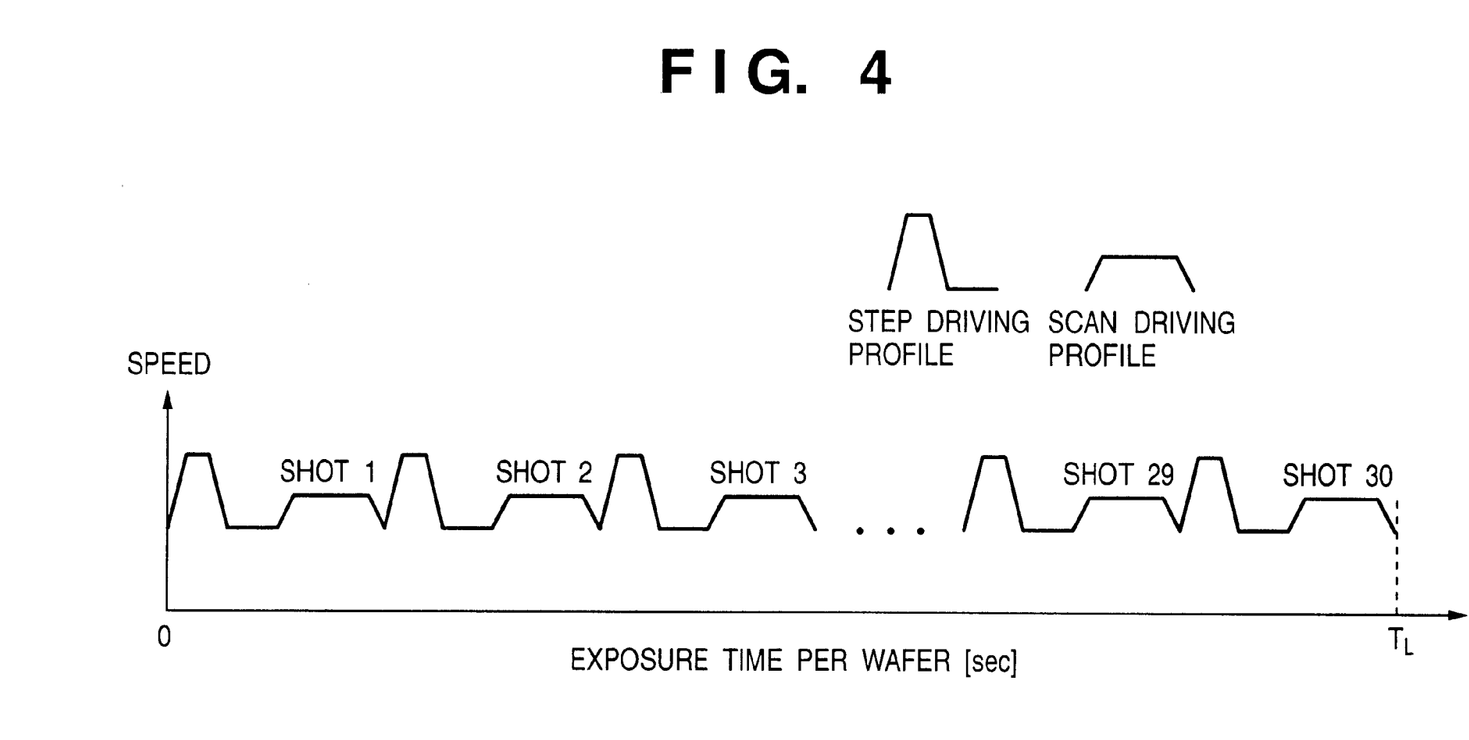
FIG. 4 is a timing chart for explaining a conventional step & scan sequence.

FIG. 4 is a timing chart for explaining a prior art arrangement to be compared with the first embodiment, and shows the time taken for step and scan exposure of one wafer. In a shot layout as shown in FIG. 2, $T_L$ [sec] represents the total time of step driving and scan driving for the first to 30th shots when the settling time is set to a predetermined value which makes the synchronization error at the start of exposure be equal to or smaller than the allowance a at all the shots. The settling time of each step driving is the same in all step driving operations.

Figure 5:
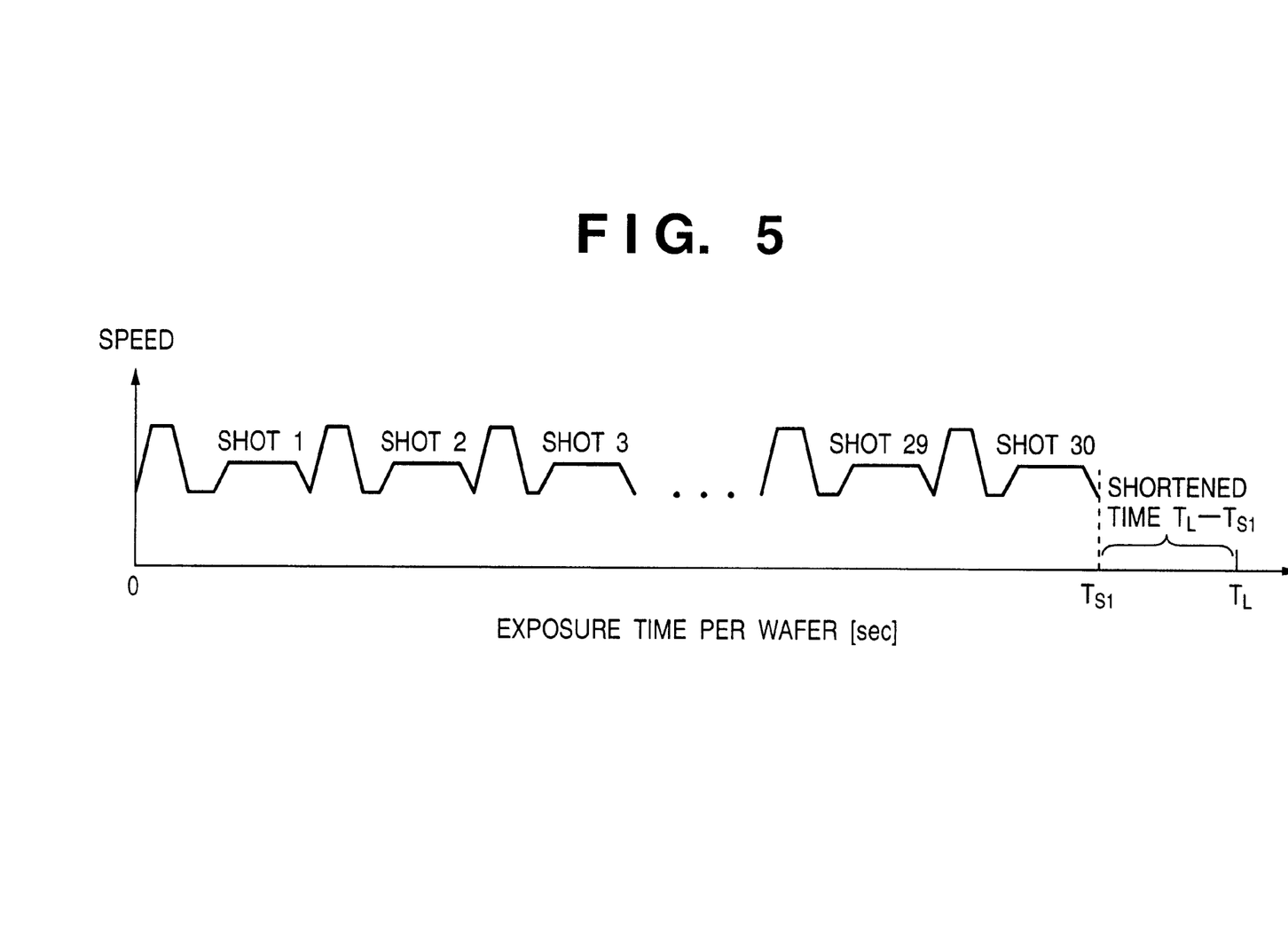
FIG. 5 is a timing chart for explaining a method of setting the settling time in step driving according to the first embodiment.

To the contrary, according to the present invention, a stage controller 11 comprises a settling time table which stores a settling time for each shot. The settling time is read out from the settling time table for each step, and a wafer stage 6 is controlled. FIG. 5 shows a step & scan exposure time $T_{S1}$ [sec] taken for the first to 30th shots when the present invention is applied. In FIG. 5, the optimal settling times of respective shots are individually set such that the synchronization error becomes equal to or lower than the allowance a at all the shots. In the first embodiment, the parameters (acceleration and speed) of the driving profile other than the settling time are the same at all the shots. The first embodiment can shorten the conventional processing time $T_L$ [sec] to $T_{S1}$ [sec], and can increase the throughput per wafer by $(T_L-T_{S1})$ [sec] without increasing the synchronization error.

If information such as the settling time for the set step driving profile is displayed on the display, the operator can see the information. This information can be displayed as a numerical value or graph for each step driving.

In the first embodiment, the stage controller 11 has the settling time table which stores settling times for 30 shots in the shot layout of FIG. 2. The stage controller 11 can be equipped with a table as a matrix made up of shot layouts, step directions, and driving profiles of scan driving immediately after step driving.

Second Embodiment

Figure 6:
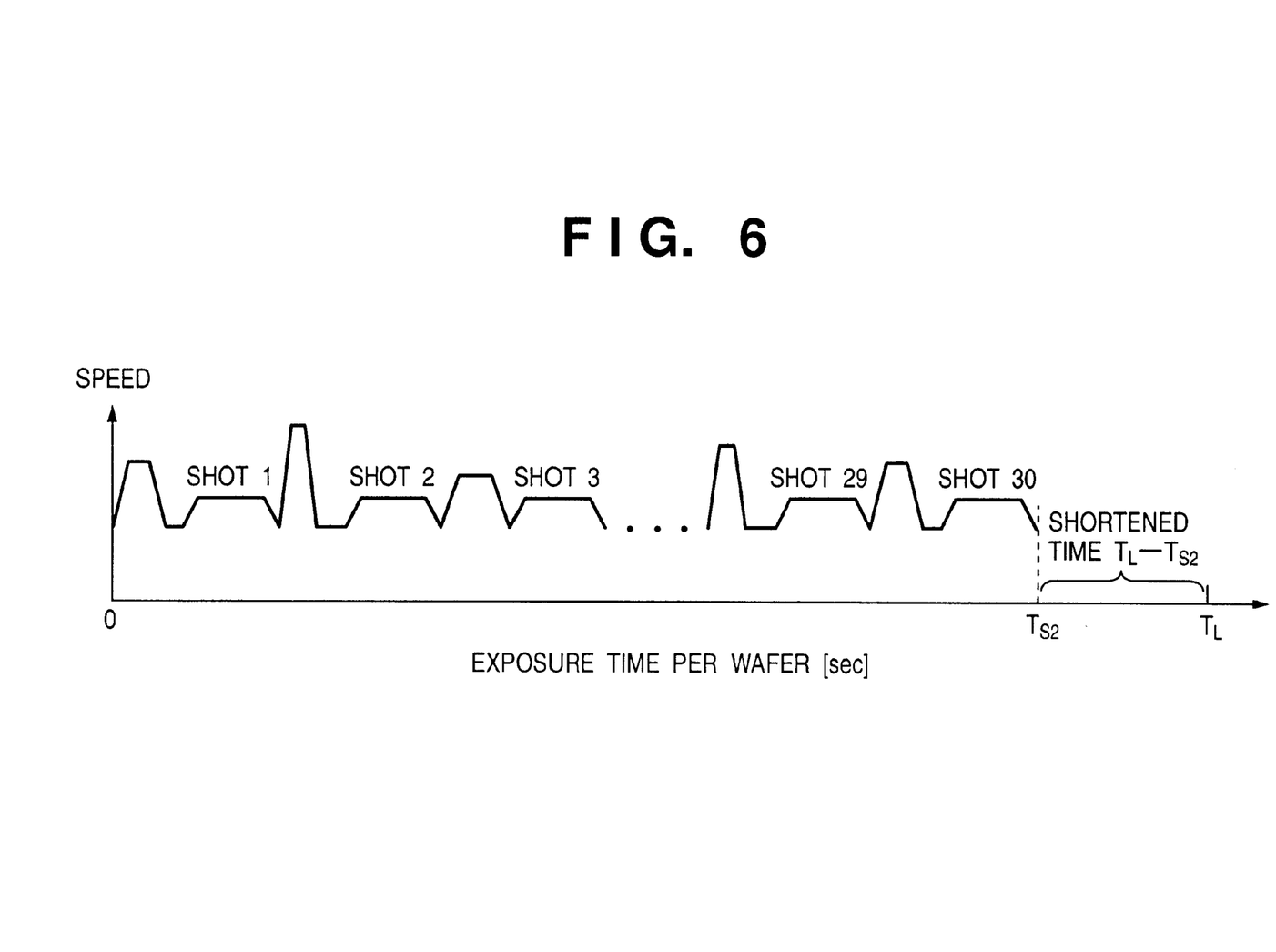
FIG. 6 is a timing chart for explaining a method of setting the acceleration, speed, and settling time in step driving according to the second embodiment.

FIG. 6 shows a step driving profile in step & scan exposure of one wafer according to the second embodiment. In the second embodiment, a stage controller 11 comprises a table which stores the acceleration, speed, and settling time of step driving for each shot. The acceleration, speed, and settling time are read out from the table for each step, and a wafer stage 6 is controlled. FIG. 6 shows a processing time $T_{S2}$ [sec] taken for the first to 30th shots when the present invention is applied to a shot layout as shown in FIG. 2. In FIG. 6, the optimal step driving accelerations, speeds, and settling times of respective shots are individually set for the shots such that the synchronization error becomes equal to or lower than the allowance a at all the shots. The second embodiment can shorten the conventional processing time $T_L$ [sec] to $T_{S2}$ [sec], and can increase the throughput per wafer by $(T_L-T_{S2})$ [sec] without increasing the synchronization error.

In the second embodiment, the stage controller 11 has the table (30×3=90) in which the step driving accelerations, speeds, and settling times of respective shots are set for the shot layout of FIG. 2. The stage controller 11 can be equipped with a multidimensional table as a matrix made up of shot layouts, step directions, and driving profiles of scan driving immediately after step driving.

Third Embodiment

Figure 7:
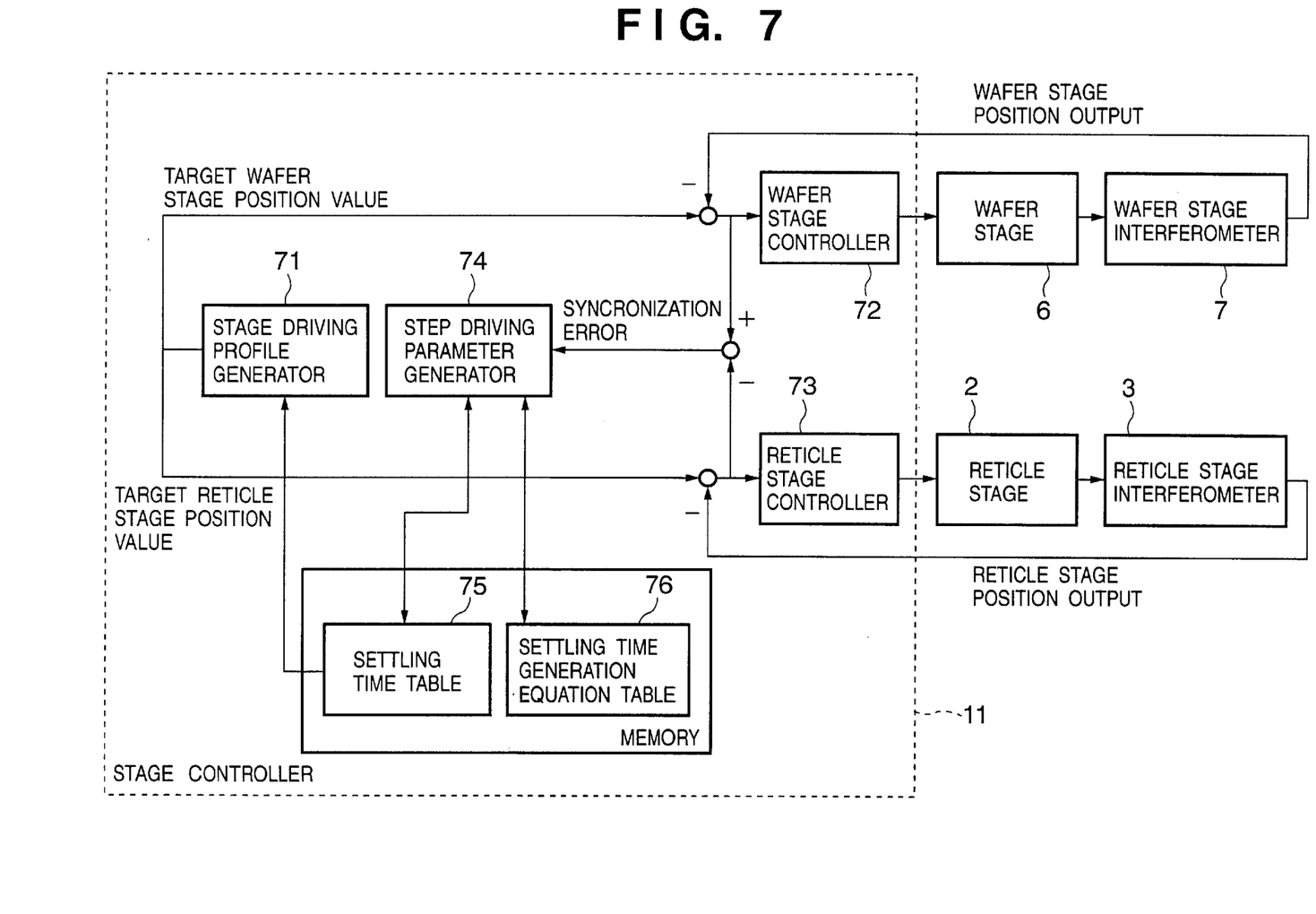
FIG. 7 is a block diagram showing part of a step & scan projection exposure apparatus according to the third embodiment.

FIG. 7 is a block diagram showing the third embodiment in which a stage controller 11 incorporates a control function of automatically setting a driving profile in step driving by learning.

A wafer stage controller 72 receives the deviation between a target wafer stage position value generated by a stage driving profile generator 71 and a wafer stage position detected by a wafer stage interferometer 7. The wafer stage controller 72 performs control operation and outputs a control signal to a wafer stage 6 on the basis of the operation result. The wafer stage 6 is driven based on the control signal from the wafer stage controller 72.

The reticle stage 2 is driven similarly to the wafer stage 6. A reticle stage controller 73 receives the deviation between a target reticle stage position value generated by the stage driving profile generator 71 and a reticle stage position detected by a reticle stage interferometer 3. The reticle stage controller 73 performs control operation and outputs a control signal to a reticle stage 2 on the basis of the operation result. The reticle stage 2 is driven based on the control signal from the reticle stage controller 73.

A wafer is exposed by repeating a sequence of performing step exposure and then scan driving (exposure). A step driving parameter generator 74 automatically corrects a settling time table 75 on the basis of $$t[ns,nw+1]=t[ns,nw]+f_{ns}(e-\alpha) \quad (1)$$

where ns: shot No. 1 to N (N is the number of shots within one wafer)

nw: wafer No. 1 to ∞ t[ns,nw]: settling time (values t[1,nw] to t[N,nw] are stored in the table 75)

e: synchronization error

α: synchronization error allowance

Letting e−α=x, $f_{ns}(x)$ : function of shot No. ns for calculating a settling time ($f_1(x)$ to $f_N(x)$ are stored in a table 76)

For x>0, $f_{ns}(x)$>0, for x<0, $f_{ns}(x)$<0, and for x=0, $f_{ns}(x)$=0

Figure 8:
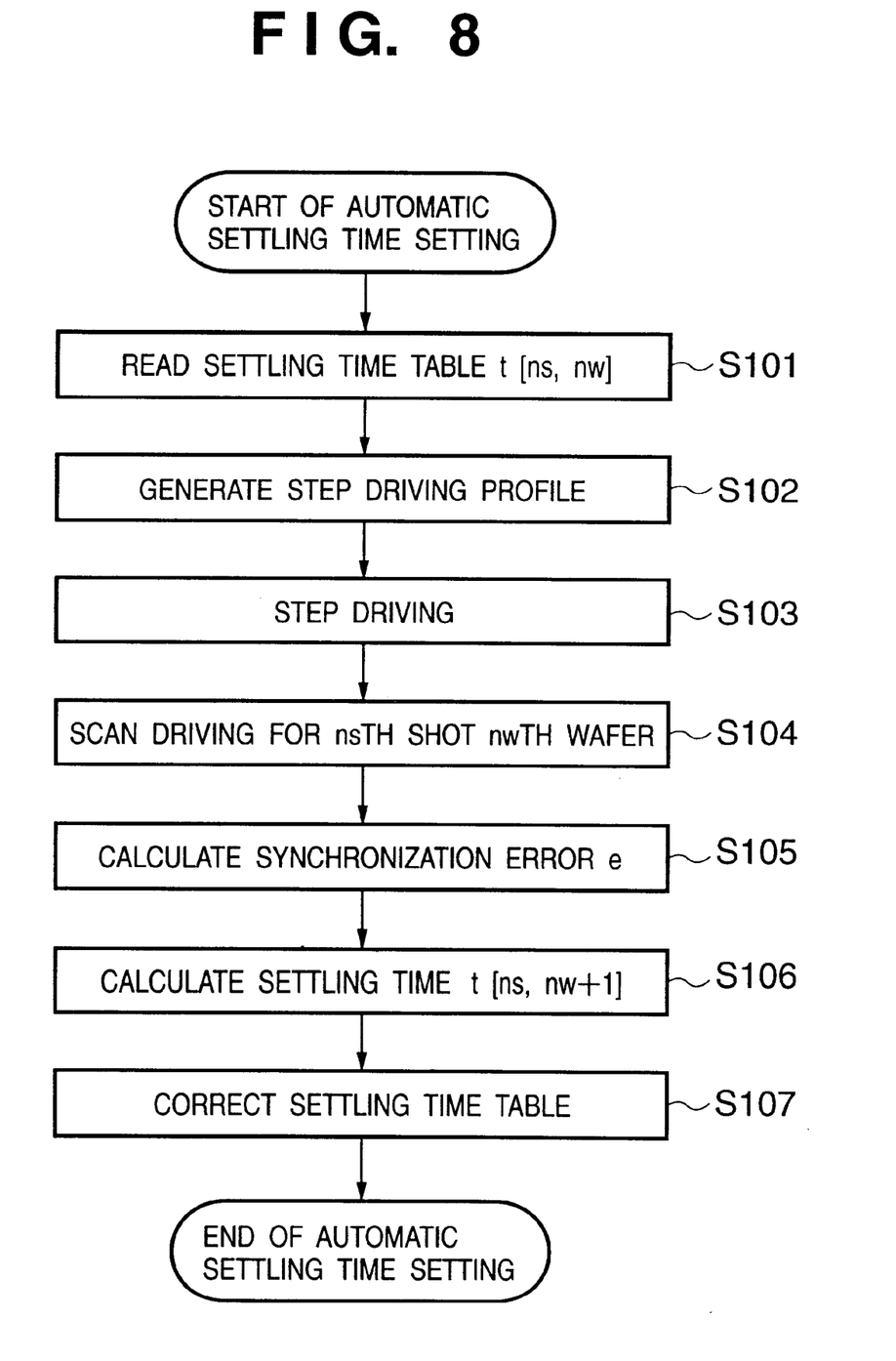
FIG. 8 is a flow chart showing a method of setting the settling time in step driving by learning control according to the third embodiment.

FIG. 8 is a flow chart showing the automatic settling time setting procedures.

Assume that a wafer having a shot layout of N shots is to be exposed. To expose the nsth shot of the nwth wafer, a corresponding settling time t[ns,nw] is read out from the settling time table 75 (step S101), and a step driving profile based on the settling time is created (step S102). Then, step driving based on the created step driving profile is executed (step S103), and scan driving is immediately done (step S104). The synchronization error e at this time is calculated from the difference between the wafer stage deviation and the reticle stage deviation during scan driving (step S105). A settling time t[ns,nw+1] of step driving for the nsth shot of the (nw+1)th (next) wafer is calculated from the synchronization error e, the synchronization error allowance α, and the settling time t[ns,nw] of current step driving (step S106), and the settling time table 75 is corrected (step S107). In step driving for the nsth shot of the (nw+1)th wafer, the stage driving profile generator 71 reads the corrected settling time from the settling time table 75 and generates a driving profile.

In the above processing, when the synchronization error e is smaller than the allowance α, the second term on the right hand side of equation (1) becomes negative, and the corrected settling time becomes shorter. When the synchronization error e is larger than the allowance α, the second term on the right hand side of equation (1) becomes positive, and the corrected settling time becomes longer. That is, at a shot where the synchronization error has a margin from the allowance, the parameters of a step driving profile are so set as to shorten the step driving time on the next wafer. At a shot where the synchronization error exceeds the allowance, the parameters of a step driving profile are so set as to reduce the synchronization error in exposing the next wafer. Accordingly, the processing time can be optimized without increasing the synchronization error.

Settling times t[1,1] to t[N,1] in step driving of the first wafer are set to the same value which makes the synchronization error be equal to or smaller than the allowance α at all shots, like the prior art. Alternatively, different settling times may be set for respective shots, like the first embodiment.

The function $f_{ns}(x)$ is prepared in advance in the settling time generation equation table 76. A simple example is $f_{ns}(x)=k \cdot x$ (k: real number larger than 0). $f_{ns}(x)$ itself may be automatically corrected by storing the preceding settling time t[ns,nw] and synchronization error e.

The third embodiment has exemplified only the settling time, but any parameters of the step driving profile, such as the acceleration and speed, can be automatically corrected by the same algorithm as that of the third embodiment. Further, the table which stores the settling time, acceleration, and speed can be automatically corrected as a matrix made up of shot layouts, step directions, and driving profiles of scan driving immediately after step driving.

Automatic setting of parameter values for each shot can increase the throughput in comparison with conventional redundant setting in which parameter values are the same at all shots.

Fourth Embodiment

<Embodiment of Semiconductor Production System>

A production system for a semiconductor device (e.g., a semiconductor chip such as an IC or LSI, liquid crystal panel, CCD, thin-film magnetic head, micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 9:
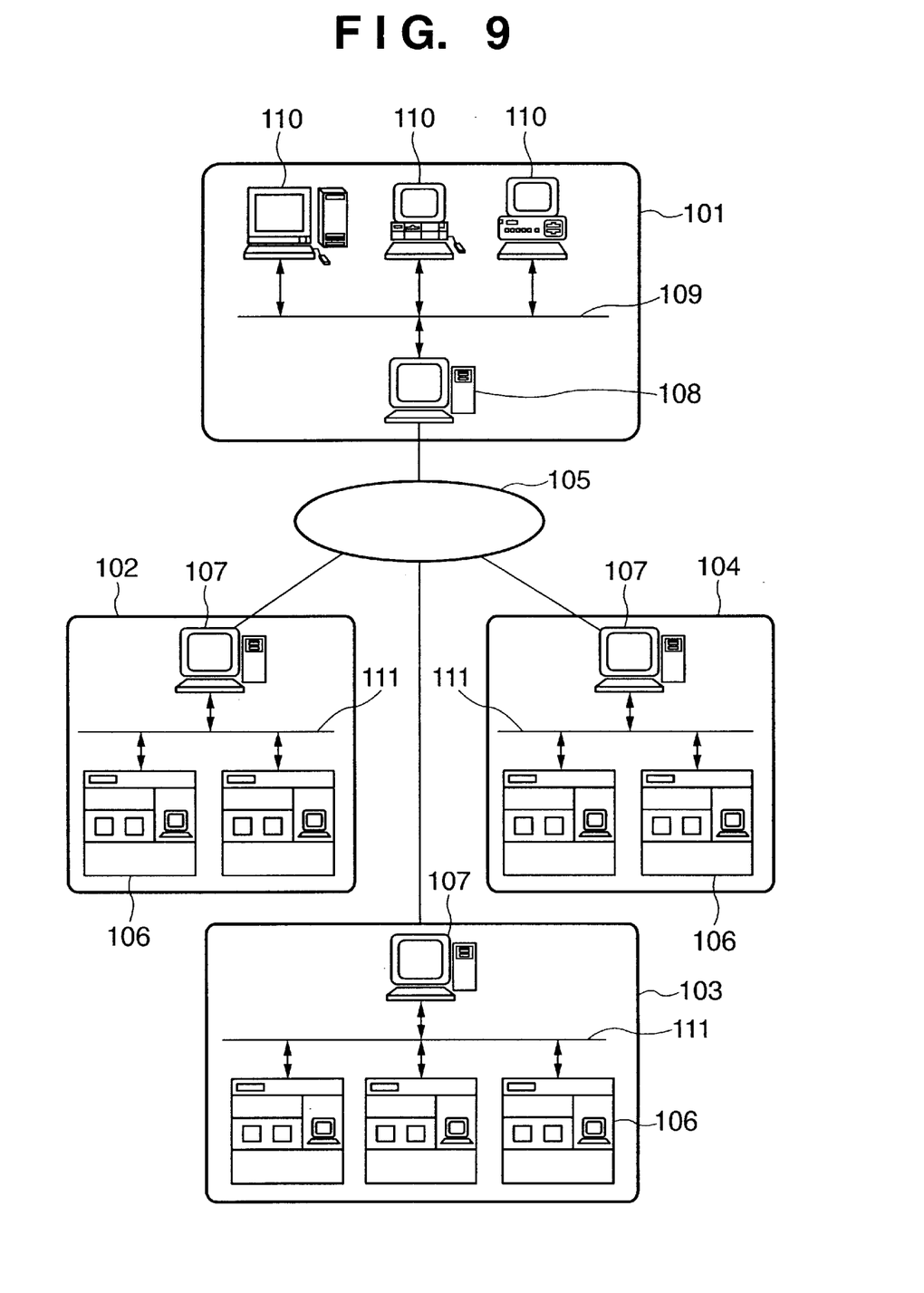
FIG. 9 is a view showing the concept of a semiconductor device production system according to the present invention when viewed from a given angle.

FIG. 9 shows the overall system cut out at a given angle. In FIG. 9, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses, (e.g., lithography apparatus including an exposure apparatus, resist processing apparatus, and etching apparatus, annealing apparatus, film formation apparatus, planarization apparatus, and the like) and post-process apparatuses (e.g., assembly apparatus, inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post-process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification, or maintenance information such as the latest software or help information. Data communication between the factories 102 to 104 and the vendor 101 and data communication protocol (TCP/IP) generally used in the Internet. Instead of using the Internet as an external network of the factory, a dedicated network (e.g., ISDN) having high security which inhibits access of a third party can be adopted. Also, the user may construct a database in addition to the one provided by the vendor and set the database on an external network, and the host management system may authorize access to the database from a plurality of user factories.

Figure 10:
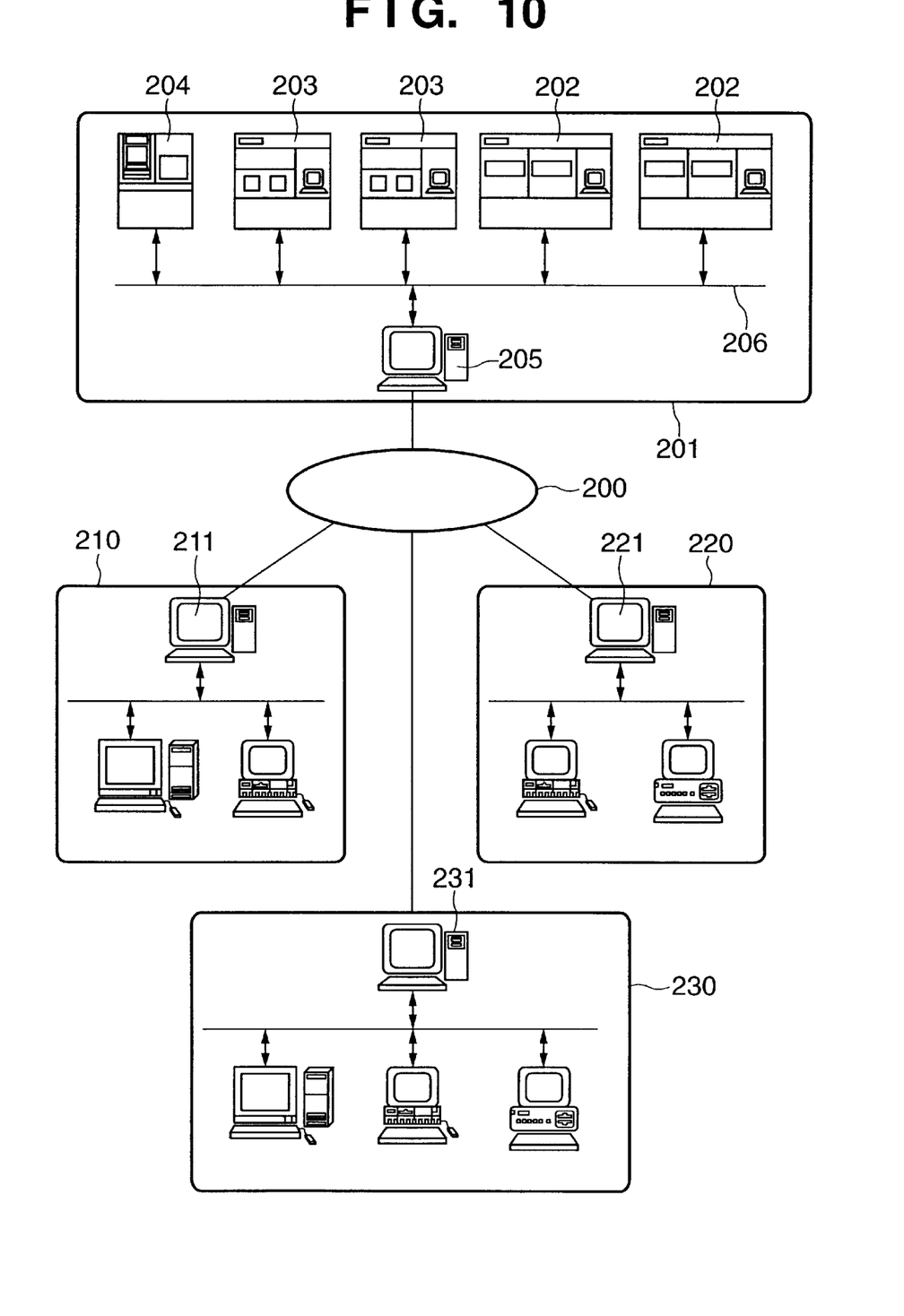
FIG. 10 is a view showing the concept of the semiconductor device production system according to the present invention when viewed from another given angle.

FIG. 10 is a view showing the concept of the overall system of this embodiment that is cut out at a different angle from FIG. 9. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 10, a factory having manufacturing apparatuses of a plurality of vendors and the management system of the vendors for these manufacturing apparatuses are connected via the external network of the factory, and maintenance information of each manufacturing apparatus is communicated. In FIG. 10, reference numeral 201 denotes a manufacturing factory of a manufacturing apparatus user (semiconductor device manufacturer) where manufacturing apparatuses for various processes, e.g., an exposure apparatus 202, resist processing apparatus 203, and film formation apparatus 204 are installed in the manufacturing line of the factory. FIG. 10 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (apparatus supply manufacturers) such as an exposure apparatus manufacturer 210, resist processing apparatus manufacturer 220, and film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Figure 11:
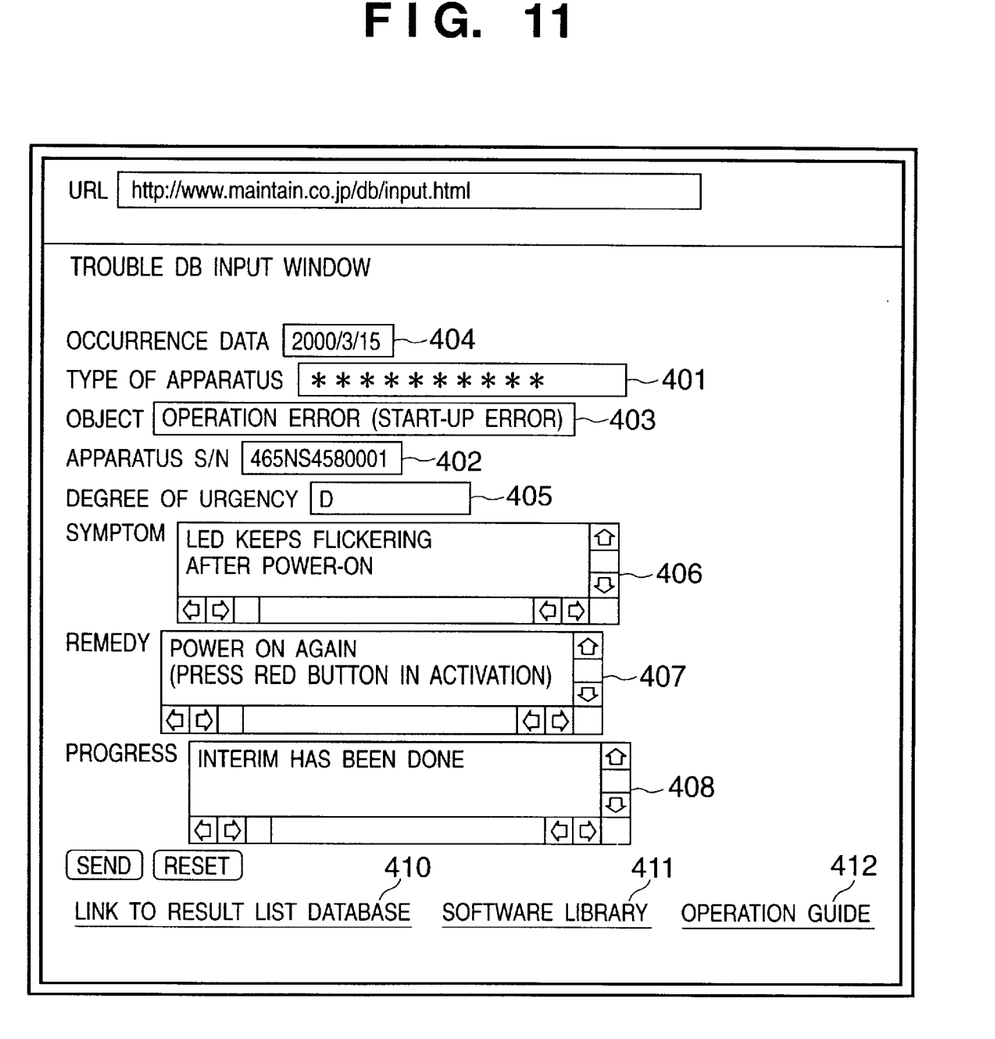
FIG. 11 is a view showing an example of a user interface in the exposure apparatus according to the present invention.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 11 on the display. While referring to this window, the operator who manages manufacturing apparatuses in each factory inputs, in input items on the windows, pieces of information such as the type of manufacturing apparatus (401), serial number (402), object of trouble (403), occurrance date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 11. This allows the operator in the factory to access detailed information of each item, receive the latest-version software to be used for a manufacturing apparatus from a software library provided by a vendor, and receive an operation guide (help information) as a reference for the operator. Maintenance information provided by the maintenance database also includes information concerning the step driving profile of the projection exposure apparatus according to the present invention described above. The software library also provides the latest software for setting the step driving profile.

Figure 12:
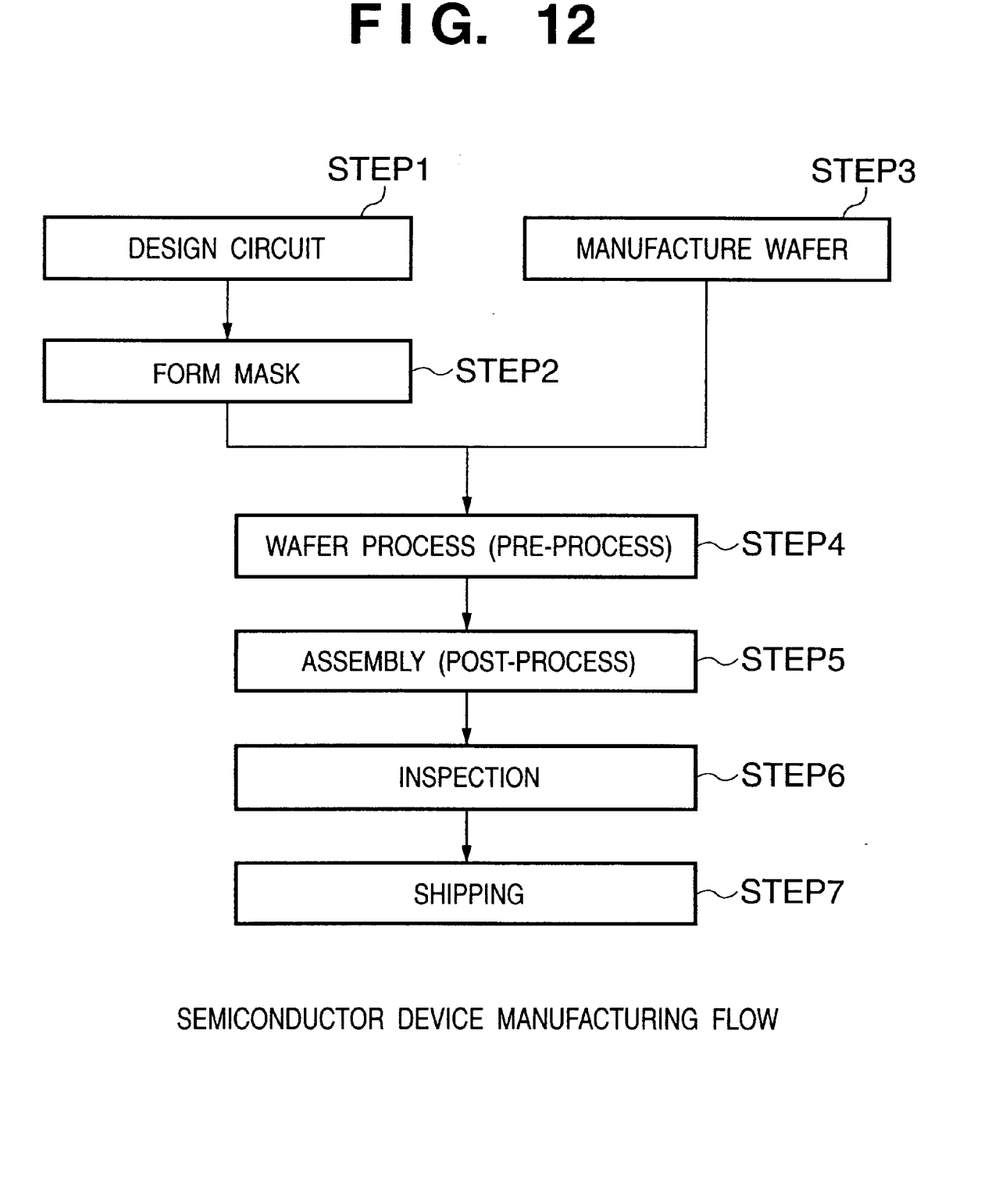
FIG. 12 is a flow chart showing the flow of a semiconductor device manufacturing process according to the present invention.

A semiconductor device manufacturing process using the above-described production system will be explained. FIG. 12 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 13:
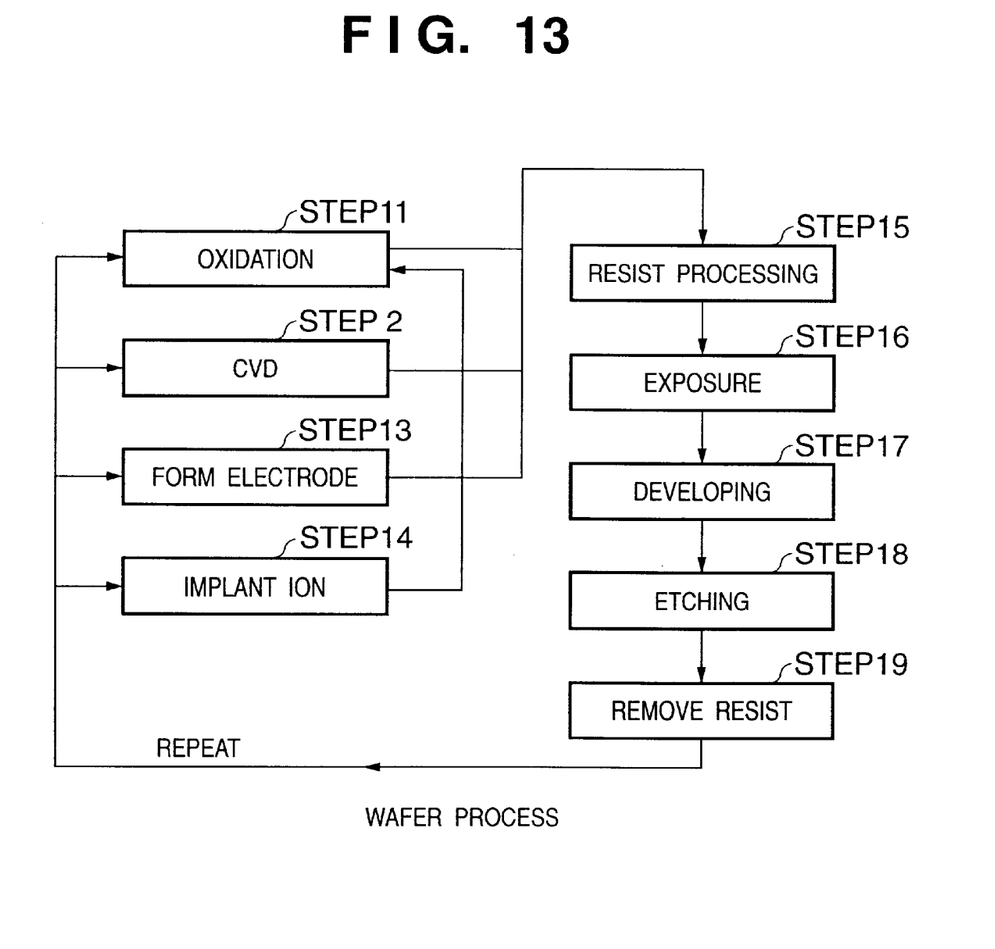
FIG. 13 is a flow chart showing the flow of a wafer process (step 4) in detail according to the present invention.

FIG. 13 shows the detailed flow of the wafer process (step 4). In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15

(resist processing), a photosensitive agent is applied to the wafer. In step 16 (exposure), the exposure apparatus of the present invention described above exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble, in advance. Even if trouble occurs, the manufacturing apparatus can be quickly recovered. The productivity of the semiconductor device can be increased in comparison with the prior art.

As has been described above, the step & scan projection exposure apparatus of the present invention can arbitrarily change the parameter values of the step driving profiles of master and substrate stages for each step driving. An optimal driving profile can be set in accordance with the conditions of each step driving, and the synchronization error between the two stages during exposure can be decreased to increase the throughput of the exposure apparatus.

The exposure apparatus of the present invention can receive maintenance using a network, and can also be applied to a semiconductor device manufacturing method and semiconductor manufacturing factory using the network.

As many apparently widely different embodiments of the present invention can be made without departing from the spirit and scope thereof, it is to be understood that the invention is not limited to the specific embodiments thereof except as defined in the appended claims.

What is claimed is:

1. A step and scan projection exposure apparatus comprising:

a master stage which can move while supporting a master;

a substrate stage which can move in synchronism with said master stage while supporting a substrate; and a controller for controlling synchronous scan driving of said master stage and said substrate stage, and setting for each step driving a step driving profile used to perform step driving on the basis of a synchronization error between said master stage and said substrate stage.

2. The apparatus according to claim 1, wherein said controller sets the step driving profile by at least one of a target exposure region layout of the substrate, a step direction, and a scan driving profile in synchronous scan driving.

3. The apparatus according to claim 1, wherein the step driving profile is determined by all parameters necessary to drive said master stage and said substrate stage.

4. The apparatus according to claim 3, wherein all the parameters include accelerations and speeds of said master stage and said substrate stage, a time taken until synchronous scan driving starts after step driving, and a time taken until exposure starts after a start of synchronous scan driving.

5. The apparatus according to claim 1, wherein said controller stores in advance the step driving profile as a matrix constituted by a target exposure region layout, a step direction, and a scan driving profile in synchronous scan driving.

6. The apparatus according to claim 5, wherein said controller automatically sets the step driving profile.

7. The apparatus according to claim 6, wherein the step driving profile is automatically set by learning performance of the exposure apparatus along with exposure of a plurality of substrates and sequentially updating the matrix.

8. The apparatus according to claim 1, wherein said controller displays information about the step driving profile on a display.

9. The apparatus according to claim 8, wherein the information about the step driving profile is displayed on the display for each step driving.

10. The apparatus according to claim 1, wherein the apparatus further comprises:

a display;

a network interface; and a computer for executing network software, wherein maintenance information of the exposure apparatus can be communicated via the computer network.

11. The apparatus according to claim 10, wherein the network software is connected to an external network of a factory where the exposure apparatus is installed, provides on said display a user interface for accessing a maintenance database provided by a vendor or user of the exposure apparatus, and enables obtaining information from the database via the external network.

* * * * *

UNITED STATES PATENT AND TRADEMARK OFFICE
CERTIFICATE OF CORRECTION

PATENT NO.     : 6,567,154 B2
DATED          : May 20, 2003
INVENTOR(S)    : Satoshi Akimoto It is certified that error appears in the above-identified patent and that said Letters Patent is hereby corrected as shown below:

<u>Title page,</u>
"*Assistant Examiner-* Andre' C Stevenson" should read
-- *Assistant Examiner-* André C. Stevenson --;

<u>Drawings,</u>
Sheet 7, FIG. 7, element 74, "SYNCRONIZATION" should read
-- SYNCHRONIZATION--.

<u>Column 1,</u>
Line 45, "a" should read -- $\propto$ --.

<u>Column 4,</u>
Lines 8, 20 and 49, "a" should read -- $\propto$ --.

<u>Column 6,</u>
Line 9, "a" should read -- $\propto$ --.

Signed and Sealed this

Eleventh Day of May, 2004

JON W. DUDAS
*Acting Director of the United States Patent and Trademark Office*